US005585783A

United States Patent [19]
Hall

[11] Patent Number: 5,585,783
[45] Date of Patent: Dec. 17, 1996

[54] MARKER LIGHT UTILIZING LIGHT EMITTING DIODES DISPOSED ON A FLEXIBLE CIRCUIT BOARD

[76] Inventor: Roger E. Hall, 992 Southwestern Dr., Jamestown, N.Y. 14701

[21] Appl. No.: 267,128

[22] Filed: Jun. 28, 1994

[51] Int. Cl.$^6$ ............................................. B60Q 7/00
[52] U.S. Cl. ................ 340/473; 340/815.45; 340/908.1; 340/985; 362/800
[58] Field of Search ..................... 340/472, 473, 340/981, 982, 983, 321, 331, 332, 815.45, 908, 908.1, 984, 985; 362/103, 84, 83.3, 800

[56] References Cited

U.S. PATENT DOCUMENTS

| | | | |
|---|---|---|---|
| 2,938,192 | 5/1960 | Adler, Jr. | 340/981 |
| 3,436,729 | 4/1969 | Zurcher | 340/981 |
| 4,231,079 | 10/1980 | Heminover | 362/800 |
| 4,375,634 | 3/1983 | Leis | 340/472 |
| 4,523,258 | 6/1985 | Morse et al. | 362/806 |
| 4,563,668 | 1/1986 | Martino | 340/473 |
| 4,570,206 | 2/1986 | Deutsch | 362/103 |
| 4,626,852 | 2/1986 | Dodge | 340/331 |
| 4,631,516 | 12/1986 | Clinker | 340/472 |
| 4,654,629 | 3/1987 | Bezos et al. | 340/641 |
| 4,736,205 | 4/1988 | Dodge | 340/985 |
| 4,772,990 | 9/1988 | Linehan et al. | 340/473 |
| 4,825,191 | 4/1989 | Ching-Hwei | 340/472 |
| 4,860,177 | 8/1989 | Simms | 340/472 |
| 4,875,028 | 10/1989 | Chou | 340/473 |
| 5,034,847 | 7/1991 | Brain | 340/321 |
| 5,081,568 | 1/1992 | Dong et al. | 340/321 |
| 5,162,696 | 11/1992 | Goodrich | 362/800 |
| 5,193,895 | 3/1993 | Naruke et al. | 362/83.3 |
| 5,319,365 | 6/1994 | Hillinger | 340/321 |
| 5,349,346 | 9/1994 | Wu | 340/473 |

*Primary Examiner*—Brent A. Swarthout
*Attorney, Agent, or Firm*—The Law Offices of Byron A. Bilicki, P.C.

[57] ABSTRACT

A marker light device includes a bendable printed circuit board, a group of light emitting diodes disposed on the bendable printed circuit board and electrically connected thereto, and a power source electrically connected to the bendable printed circuit board, thereby causing the illumination of the group of light emitting diodes. The bendable printed circuit board includes an electronic circuit for intermittently turning the group of light emitting diodes on and off at a predetermined time interval to provide a flashing light. The bendable printed circuit board, when folded such that the opposite ends thereof substantially meet, includes two panels such that the group of light emitting diodes disposed on the first panel faces in a direction generally opposite to the group of light emitting diodes disposed on the second panel, whereby the light emitting diodes project light in substantially parallel beams.

5 Claims, 9 Drawing Sheets

MARKER LIGHT UTILIZING LIGHT EMITTING DIODES DISPOSED ON A FLEXIBLE CIRCUIT BOARD

BACKGROUND OF THE INVENTION

1. Field of the Invention

This invention relates generally to marker lights employed on vehicles and, more particularly, to marker lights for Amish buggies to alert trailing and oncoming motorists traveling at night, or at other times of poor visibility, of the presence of an Amish buggy on a roadway.

This invention also relates generally to hazard warning devices and, more particularly, but not by way of limitation, to a portable electric warning light used by fire and police departments to alert motorists to disabled vehicles or other road hazards.

The marker light of the present invention also has application as an underwater lighting device and an emergency lighting device used in stairwells and other locations within buildings, as well as on boats and in the water to alert boaters to disabled boats and persons overboard.

2. Description of the Prior Art

The device commonly used on Amish buggies, trucks, and farm equipment, such as tractors, to alert other motorists to a slow moving vehicle is a slow moving vehicle sign, which is commonly referred to as a SMV sign. A SMV sign consists simply of a flat metallic surface with strips of reflective material arranged in the shape of a triangle. The strips are affixed to the metallic surface. The sign is then attached to the rear end of the vehicle. A commonly used device to alert motorists to a disabled vehicle is a reflective red triangle, which may be made collapsible and provided with an integral prop for purposes of alerting other motorists when a vehicle is disabled. While easy to use and relatively inexpensive, in that they can be reused indefinitely if sturdy enough, SMV signs and reflective red triangles depend for their effectiveness upon the reflection of light transmitted by an approaching vehicle and are thus limited in their usefulness. Moreovers, reflective warning devices typically have a restricted viewing angle so that they must be carefully oriented to pick up the internal source of illumination. Such reflective warning devices typically perform poorly under conditions of marginal visibility, such as fog, rain or smoke.

Other devices commonly used to alert motorists to disabled vehicles on highways include slow burning red pyrotechnic flares, chemical flares and electric lights. Pyrotechnic flares have various disadvantages, of which some of the most evident are limited shelf life, susceptibility to dampness, the use of highly combustible material, as well as the possibility of accidental burns to the user or the starting of fires if carelessly used. In addition, there is often no means available for supporting such flares in an upright position during use, and their visibility may be considerably reduced if they lie flat on the ground. Such a flare can of course be used only once, and is difficult to extinguish once lit.

Chemical flares typically give off a low intensity light. Such flares typically have a limited operating life, such as approximately twenty minutes, for example. Chemical flares are not reusable, which is at least one factor in making them relatively expensive. The heat generated by a chemical flare makes it unsafe in flammable environments. The spent flare is solid waste that can pose a disposal problem. A flare can be unreliable in rain or snow because the moisture can adversely affect the chemical reaction by which the flare works.

As to electric warning lights, some give off low intensity illumination, thereby making them relatively hard to see. Others may give off high intensity illumination, but these typically can operate only for a relatively short time when battery powered. These also tend to be bulky so that it is inconvenient to transport them. These electrical devices often employ incandescent lamps with filaments which can be easily broken. Accordingly, they cannot survive even moderate abuse. Additionally, when one incandescent lamp in a multiple lamp arrangement becomes inoperable, illumination is significantly reduced. Moreover, they are relatively expensive.

Light emitting diodes (LEDs) have been suggested for use in signal lights, both on vehicles and in traffic control lights. For example, U.S. Pat. Nos. 4,277,819; 4,298,869 and 4,329,625 disclose the use of LEDs in vehicle lights specifically for identification and use as stop lights, brake lights and the like. U.S. Pat. No. 4,271,408 describes a light emitting display employing LEDs disposed on concave mirror surfaces, to provide patterns, such as may be used in a traffic signal device. LEDs in combination with lenses are shown in U.S. Pat. Nos. 4,009,394 and 4,185,891. In addition, several of the above mentioned patents also describe circuits for the LEDs. Such circuits are shown in U.S. Pat. Nos. 4,045,683; 4,190,836 and 4,420,711.

U.S. Pat. No. 5,122,781 discloses a hazard warning device for use in place of a conventional flare, which includes a lamp assembly utilizing battery formed of button cells to over-run two light emitting diodes (LEDs) under control of a low duty cycle low frequency oscillator. A printed circuit board carries an integrated circuit, resistors, a capacitor and two LEDs. The lamp assembly is built into a lens at one end of a baton-like device, the remainder of which is a stem provided with a strut assembly similar to an umbrella frame which can be deployed between a folded condition with the struts lying against the stem and a deployed condition in which it forms a tripod support for the device.

U.S. Pat. No. 4,654,629 discloses a marker light utilizing an array of light emitting diodes in combination with lenses to provide a light beam of required intensity, shape and color emanating from the rear end of the last car of a train.

None of the patents mentioned above discloses the use of LEDs to provide a light source with an expanded viewing angle such that it can be seen by, fox example, trailing, oncoming and passing motorists while at the same time providing such motorists with maximum light intensity.

More importantly, none of the patents mentioned above disclose the use of a flexible, bendable circuit board on which LEDs are mounted. The circuit boards disclosed in U.S. Pat. Nos. 4,654,629 and 5,122,781 are rigid or semi-rigid and are therefore incapable of directing the LEDs in various diverging, parallel or converging directions without the utilization of multiple rigid or semi-rigid circuit boards, special mounting hardware or custom bending of light source mountings or leads.

In view of the foregoing shortcomings of these various types of warning devices and marker lights, there is the need for an improved marker light device that is durable, and can operate in damp, cold and otherwise inclement weather. Additionally, a need exists for such an improved marker light device to have a wide viewing angle, as well as be highly visible under poor visibility conditions, such as in fog, rain, smoke, snow and underwater.

Moreover, a need exists for such an improved marker light device to remain in operation over an extended period of time, to present no harm to the environment, and that is relatively economical.

SUMMARY OF THE INVENTION

The present invention overcomes the above-identified and other shortcomings of the prior art by providing a novel and improved marker light device that is easily handled and capable of being transported. The marker light of the present invention is highly visible under widely varying conditions and operates for an extended period of time compared to well known hazard warning devices. The illumination provided by the marker light of the present invention is visible over a wide angle or field of view. Its operation is substantially unaffected by poor weather conditions. It is durable and presents little or nor environmental hazards. In addition, it is relatively economical to manufacture, since multiple rigid circuit boards and their associated custom hardware and mountings are not necessary to achieve the varied direction of the LED light sources. Additionally, the use of a flexible circuit board permits the control circuitry to be carried by the flexible circuit board, thereby reducing the number of multiple circuits, which, in turn, reduces manufacturing costs.

The present invention provides a marker light device comprising at least one bendable printed circuit board, a group of light emitting diodes disposed on the bendable printed circuit board and electrically connected thereto; and, a power source electrically connected to said at least one circuit board, thereby causing the illumination of said group of light emitting diodes.

Pursuant to a presently preferred embodiment, the marker light device of the present invention further comprises a housing for the power source, desirably a long shelf life battery; a housing for the group of light emitting diodes; a gasket positioned between the power source housing and the light source housing, thereby providing a fluid-tight seal between the power source housing and the light source housing; and, fastening means for securing the power source housing to the light source housing.

The substantially rectangular, bendable printed circuit board of a presently preferred embodiment, when folded such that the opposite ends of the bendable printed circuit board substantially meet, includes two panels such that the group of light emitting diodes disposed on the first panel faces in a direction generally opposite to the group of light emitting diodes disposed on the second panel, whereby said light emitting diodes project light in substantially parallel beams.

The group of light emitting diodes of a presently preferred embodiment comprise linear arrays which are aligned in at least two parallel rows. The light source housing, in a presently preferred embodiment, is comprised of a double convex lens shaped end and a flange end, whereby said double convex lens shaped end houses the group of light emitting diodes and the flange end is secured to said power source housing. A presently preferred embodiment of the present invention further includes an electronic circuit integral with or carried on the bendable circuit board for continuously illuminating the array of light emitting diodes or for intermittently turning the array of light emitting diodes on and off at a predetermined interval so as to provide a flashing light.

In a second preferred embodiment, the bendable printed circuit board is folded into the shape of a cylinder such that the group of light emitting diodes disposed thereon project light in substantially parallel beams in substantially all directions. An electronic sequencer circuit is carried on the bendable printed circuit board for intermittently turning the light emitting diodes on and off at predetermined time intervals to provide the appearance of a rotating beacon.

In a third preferred embodiment, the bendable printed circuit board is comprised of a convex surface and a concave surface, whereby the group of light emitting diodes are disposed on the convex surface such that the light emitting diodes project light in diverging beams so as to provide a source of diffuse light.

In a fourth preferred embodiment, the bendable printed circuit board is comprised of a concave surface and a convex surface, whereby the array of light emitting diodes are disposed on the concave surface such that the light emitting diodes project light in converging beams so as to provide a concentrated point illuminator.

Other details and advantages of the present invention will become apparent as the following description of the presently preferred embodiments of practicing the invention proceeds.

BRIEF DESCRIPTION OF THE DRAWINGS

The invention will become more readily apparent from the following description of preferred embodiments thereof shown, in the accompanying drawings, wherein.

DETAILED DESCRIPTION OF THE INVENTION

In the following description, numerous specific details are set forth in order to provide a more thorough understanding of the present invention. However, it will be apparent to one skilled in the art that the present invention may be practiced without many of these specific details. In other instances, well known circuits and elements are not described in detail in order not to obscure the present invention unnecessarily.

Figure 1:
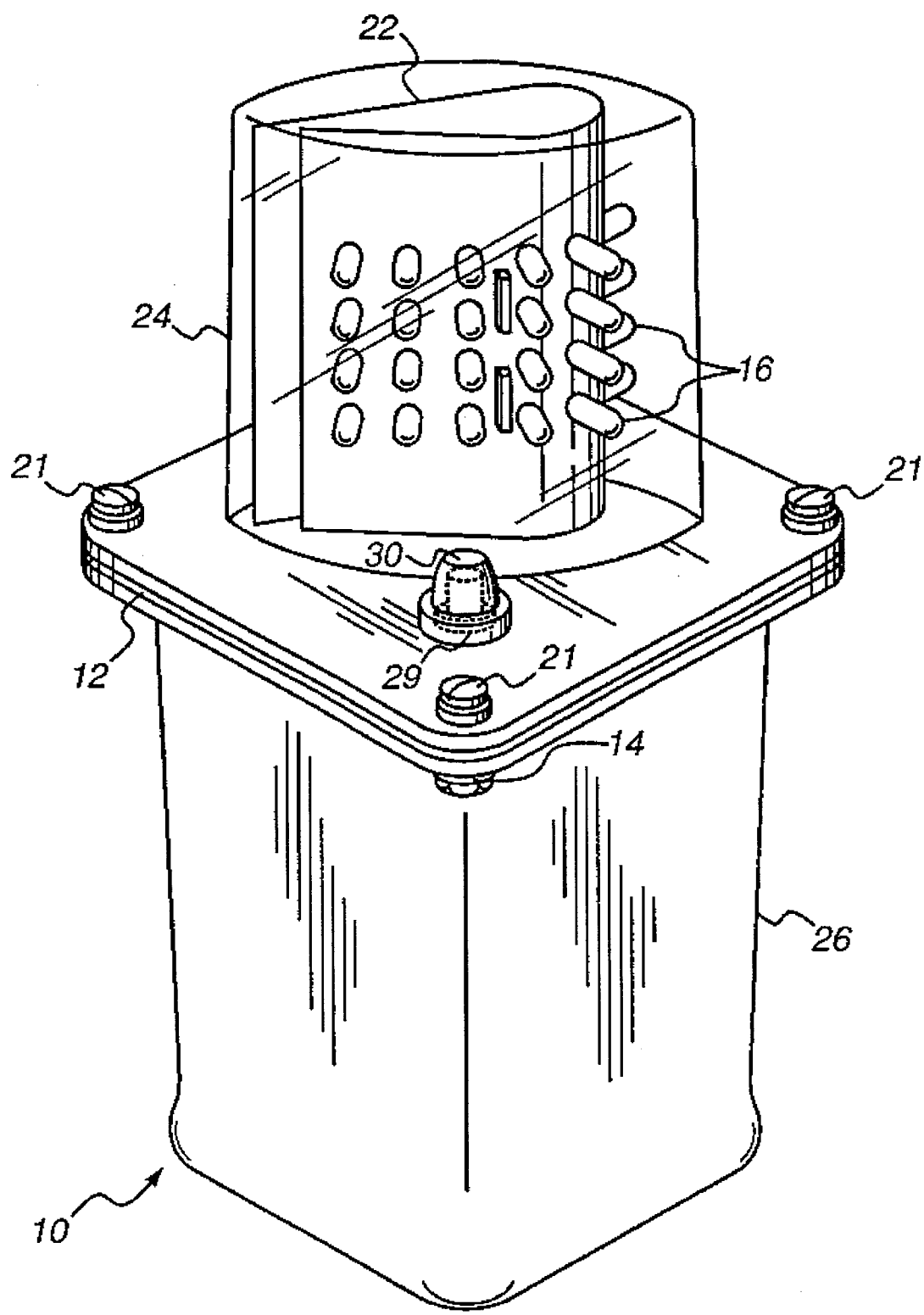
FIG. 1 is a perspective view of a first preferred embodiment of a marker light device constructed in accordance with the present invention.
Figure 2:
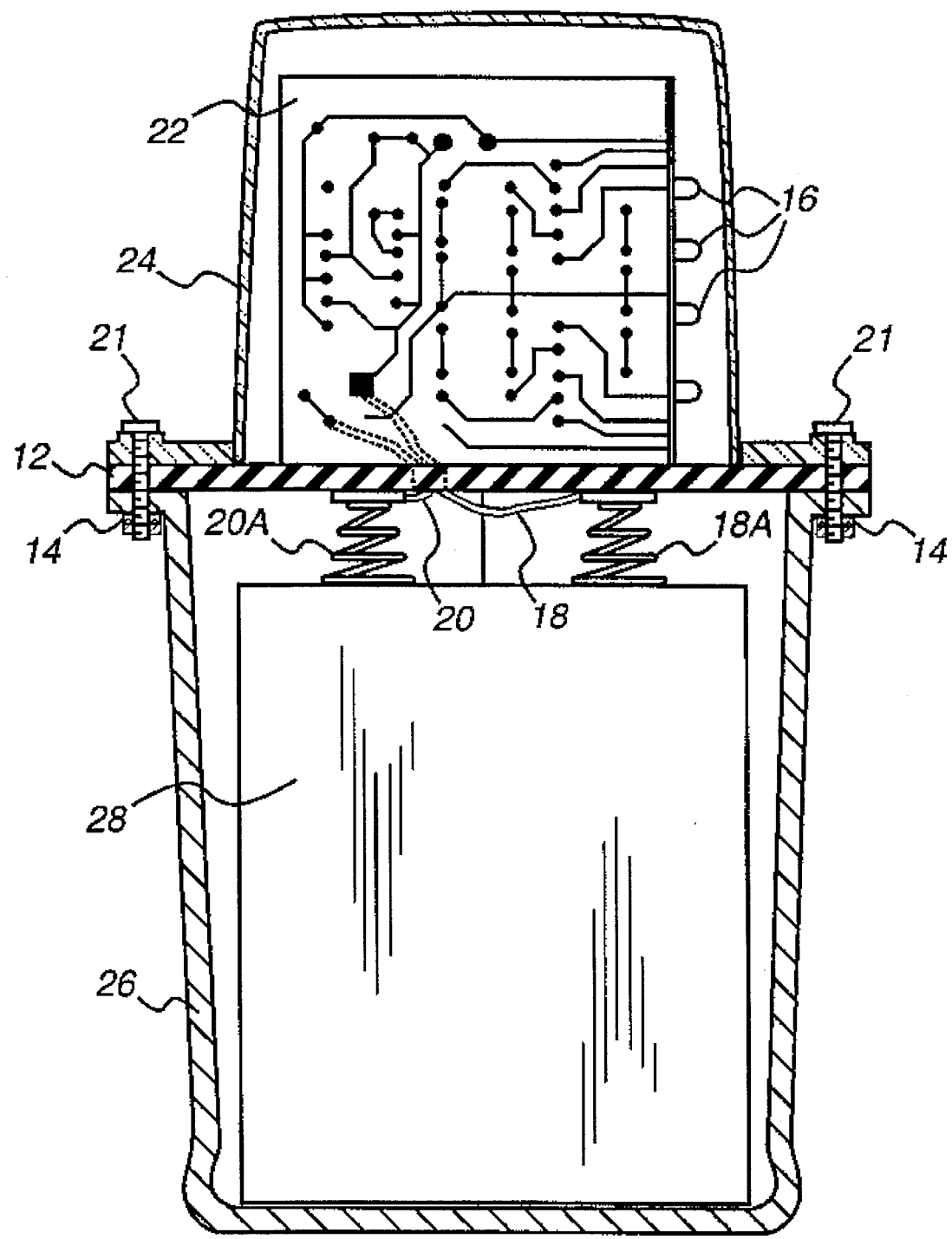
FIG. 2 is a cross-sectional side view of a first preferred embodiment of a marker light device constructed in accordance with the present invention.
Figure 3:
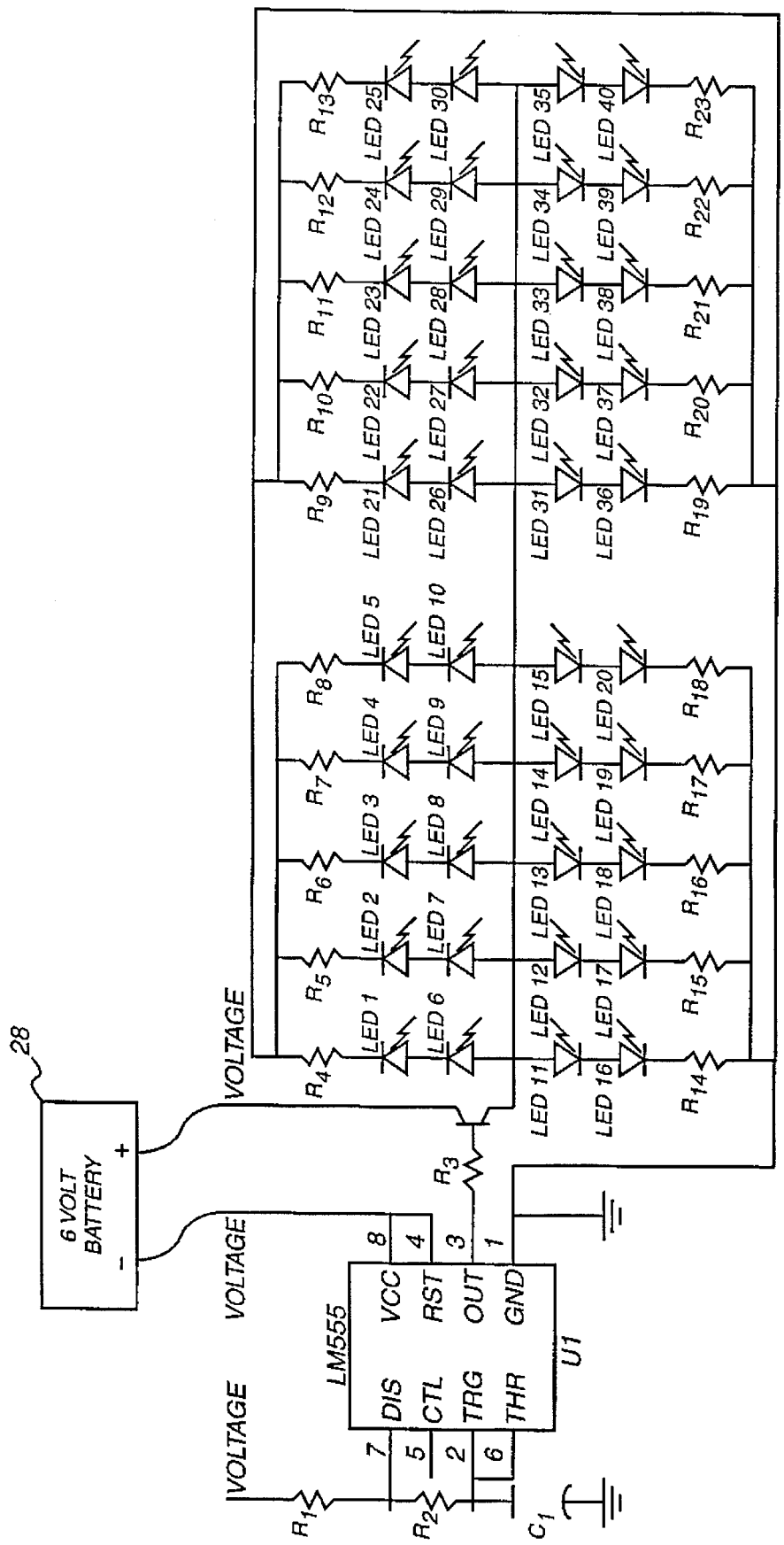
FIG. 3 is a schematic diagram of the printed circuit board depicted in FIG. 2.
Figure 4:
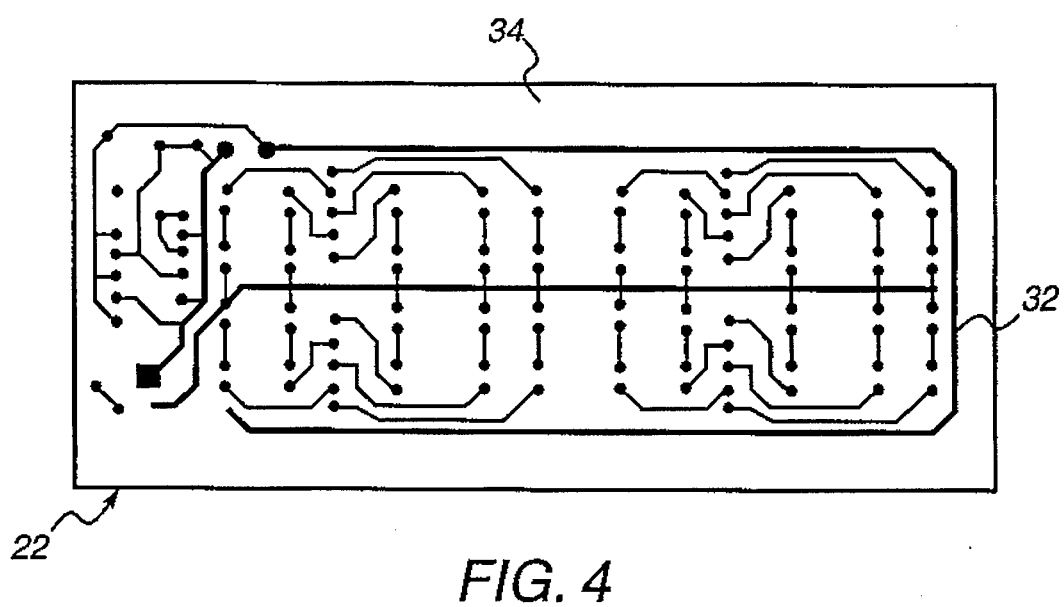
FIG. 4 is a top view of the component side of a printed circuit board of a first preferred embodiment of a marker light device constructed in accordance with the present invention.
Figure 5:
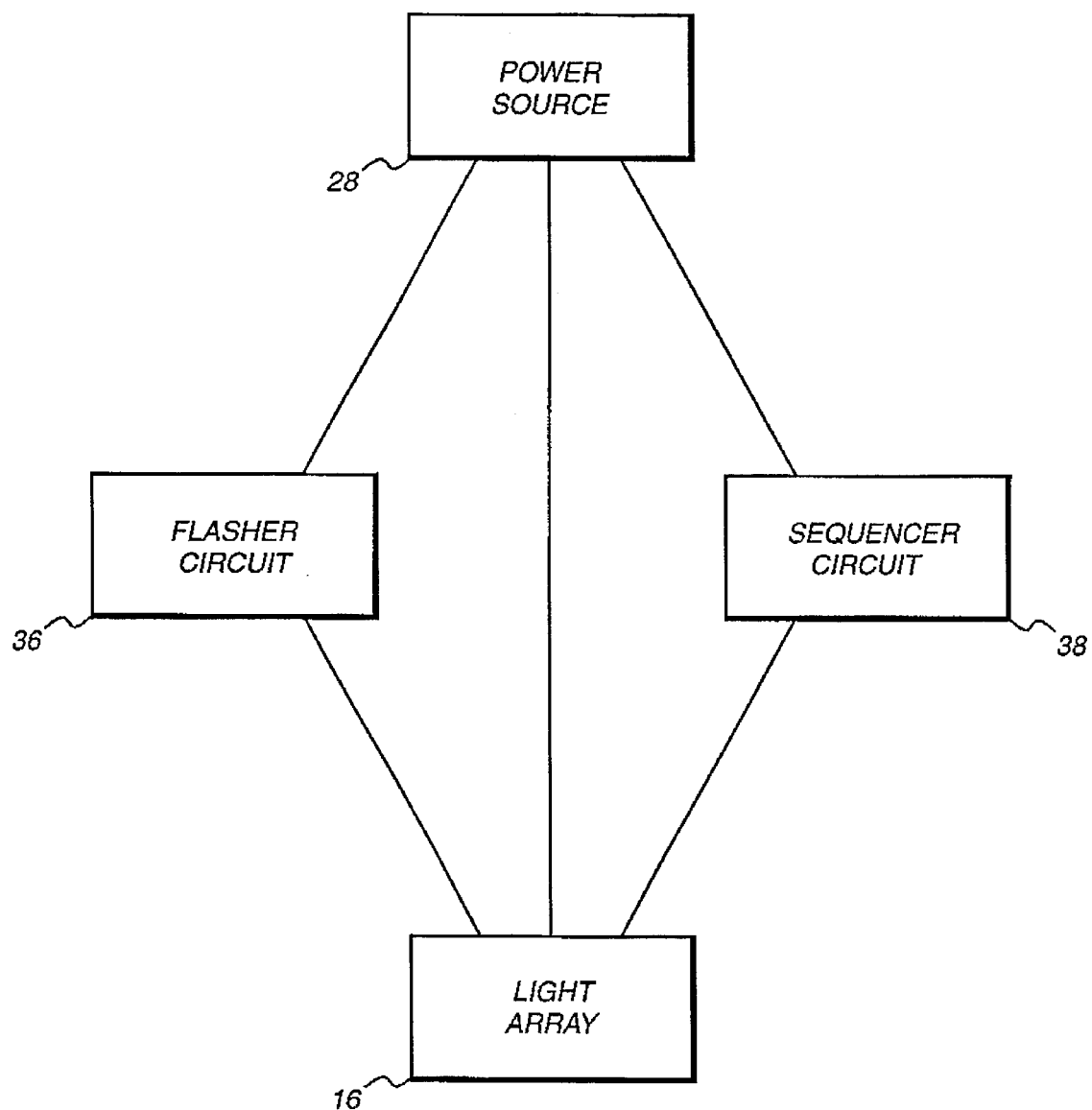
FIG. 5 is a block diagram of the flashing circuitry, continuous circuitry and sequencing circuitry used in accordance with the present invention to produce the desired flashing or non-flashing light pattern.
Figure 6:
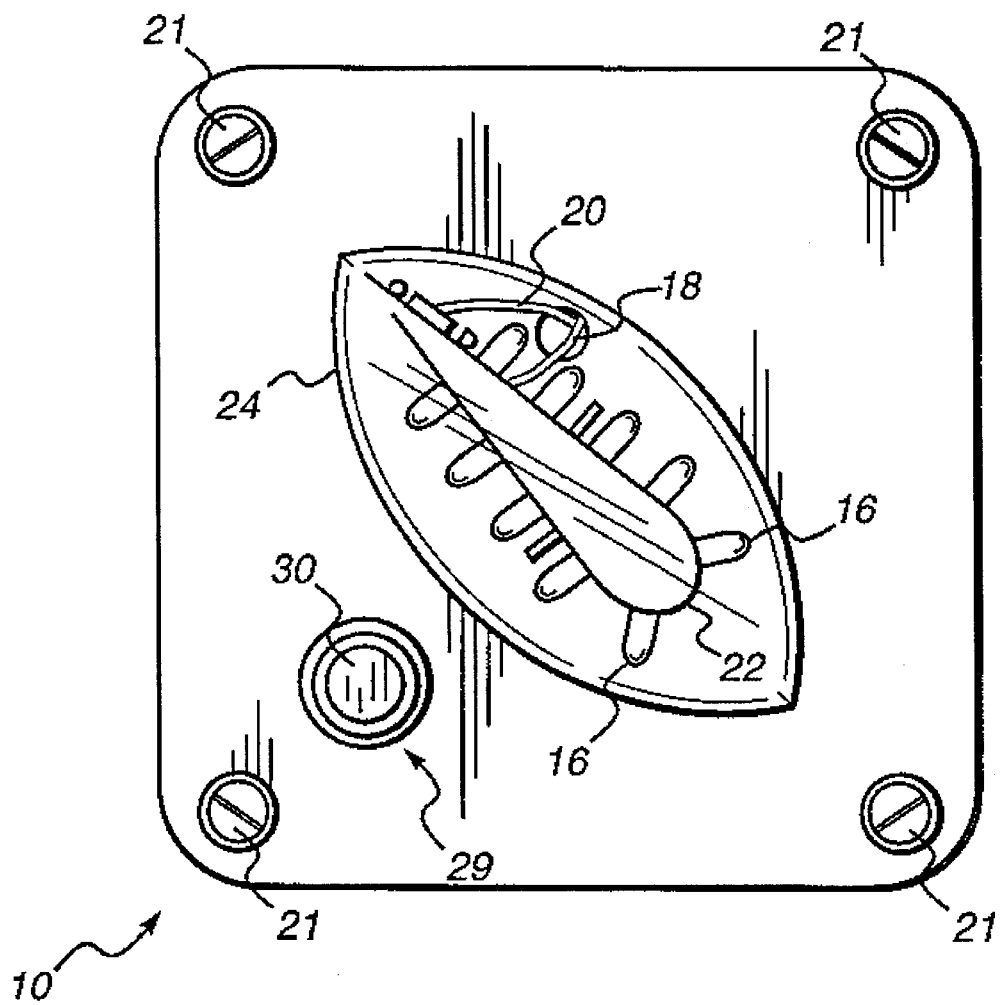
FIG. 6 is a top view of a first preferred embodiment of a marker light device constructed in accordance with the present invention.

Referring first to FIGS. 1 through 3, there is depicted a presently preferred embodiment of a marker light, identified herein by reference numeral 10, constructed according to the instant invention.

Marker light 10 includes a flexible circuit board 22, which carries an integrated circuit U1, resistors R1–R23, capacitor C1, and light emitting diodes 16 (LEDs). LEDs 16 are individually identified as LED1–LED40 in FIG. 3. The LEDs 16 have a long service lifetime and are highly efficient emitters of light of useful wavelength which distinguishes them from other lamps, particularly incandescent lamps. In the practice of this invention, it is preferred to select LEDs with a wavelength in the red–orange–amber color range. LEDs which transmit light in the blue, green and white color ranges may also be utilized in the present invention. Suitable LEDs are available commercially in sizes ranging from T1 to T4, with T1 ¾ being most preferable for purposes of the present invention. Commercially available LEDs with red lamps typically exhibit a luminous intensity of at least 2000 millicandela, while amber lamps typically exhibit a luminous intensity of at least 1000 millicandela. It is most preferable, for purposes of practicing the instant invention, to utilize LEDs with the aforementioned luminous intensities.

The integrated circuit U1 is an industry standard 555 stable multivibrator circuit with driver transistor, which, in the configuration used, provides an oscillator circuit of approximately 3 milliamperes whose characteristics are determined by external components, and an output circuit for driving an external load. The internal output circuit may be supplemented by an external switching transistor to enhance the switching characteristics and driving capability of the internal circuit. The resistors R1 and R2 together with the capacitor C1 are the external components, selected to provide an oscillator output to the transistor having, most preferable, a one second repetition rate and, most preferably, a 25–100% duty cycle, while the resistors R4–R23 are selected to limit the current through LEDs 16. Since the LEDs are designed to outlast the usefulness of power source 28, they are operated substantially at the manufacturer's suggested current draw per LED. The duty cycle means that the current through the LEDs does not exceed their rated continuous current. The resistors R4–R23 are selected so that when operated in the circuit shown in FIG. 3, the LEDs will still have a mean time before failure substantially in excess of the expected duration for which the power source can drive the circuit before becoming exhausted. As will be appreciated by those skilled in the art, the charging time is determined by R1 and R2 in series with C1. The discharging time is determined by C1 and R2. The minimum value of R1 is 1k; the maximum value of R1 +R2 is 3.3 megohms. TTL fan-out is more than 10. The RST input will drive the output low if it is grounded. If unused, it is, most preferably, tied to +5 volts. The output is high during the astable charging time and low during the discharge time.

Most preferably, power source 28 is a relatively low voltage unregulated DC power supply such as a standard 6 volt battery. Although a standard 6 volt battery is presently preferred, other batteries with voltages ranging from 6 to 12 volts may be suitably employed. Additionally, flexible circuit board 22 may receive power from a remote, typically DC, power source (not illustrated) by a power transmission cables known in the art. Additionally, the marker light of the instant invention can be adapted to operate with an AC adaptor. A relatively constant current (i.e., a current that is independent of the changes in battery voltage within a certain range) is required to maintain the required level of illumination. Other considerations in such an environment are low power drain and low failure rate of LEDs.

As shown in FIG. 3, ten strings of LEDs 16 are shown. Each string includes 4 LEDs connected in series. One end of each of the strings of LEDs is connected by means of positive lead 18 to positive terminal 18a of power source 28 which, again, most preferably, is a 6 volt battery. The other end of each string is either connected, by means of negative lead 20, to negative terminal 20a of power source 28, or, in the alternative, to a control circuit, which can either be flasher circuit 36 or a sequencer circuit 38, both of which are well known in the art. Flasher circuit 36 and sequences circuit 38, as the case may be, are electrically connected to power source 28 by leads or other means well known in the art. Terminals 18a and 20a are, most preferably, spring top terminals. It will be appreciated that nuts and the like may be employed. Connection directly to negative terminal 20a results in continuous illumination of the light emitting diodes. Although the presently preferred embodiment of the instant invention utilizes 40 LEDs, it will be appreciated that any number of LEDs can be used to increase or reduce the luminous intensity of the marker light of the present invention.

When the marker light of the present invention is no longer required, it may be turned off by depressing switch 29 which breaks the circuit between power source 28 and printed circuit 32. As is well known in the art, to activate the marker light of the present invention, switch 29 is depressed a second time to complete the circuit between power source 28 and printed circuit 32. Most preferably, switch 29 is a single pull, single throw, push on, push off switch. It will be appreciated, however, that other suitable switches such as a three-way switch and the like may be employed to allow one to choose between a flashing LED pattern and a steady-on state in addition to being able to turn off the device. Boot 30 is employed to cover switch 29 in order to create a fluid-tight seal. Most preferably, boot 30 is constructed of a waterproof material such as rubber, neoprene, silicone rubber or the like, which is sufficiently pliable to allow depression of the switch.

Flexible circuit board 22 is constructed of a nonwoven fiber reinforced epoxy laminate material, such as that made available by the Rogers Corporation, for use in multiplane circuit boards and interconnection arrangements. Such a formable laminate material is sufficiently rigid to carry electrical components, such as printed circuit 32 of the present invention, without buckling, yet is flexible enough to bend into various multiplane geometries without breaking. Printed circuit 32, according to a presently preferred embodiment, carries flasher circuit 36 and/or sequencer circuit 38 in addition to well known circuitry to effect continuous illumination of LEDs 16.

The marker light 10 further comprises housing 26 for power source 28, light source housing 24 for light emitting diodes LEDs 16, gasket 12, and fastening means comprised of, for example, washers 14 and screws 21. According to a presently preferred embodiment, gasket 12 includes an adhesive coating on at least one side thereof positioned between power source housing 26 and light source housing 24, thereby providing a fluid tight seal between power source housing 26 and light source housing 24.

Light source housing 24 is constructed of a durable plastic material such as, most preferably, a polycarbonate material such as that manufactured under the trade name Lexan LS1. The polycarbonate material need not be highly polished. Most preferably, it is not highly polished so as to better scatter the light from LEDs 16. The polycarbonate material, of which light source housing 24 is constructed, is transparent or translucent so as to permit light emanating from LEDs 16 to pass through light source housing 24. Most preferably, light source housing 24 is clear, in the case of a transparent housing, and is red or amber, in the case of a translucent housing. Pursuant to a presently preferred embodiment, light source housing 24 is comprised of a double convex lens shaped end and a flange end where the double convex lens shaded end houses LEDs 16, and the flange end is secured to power source housing 26 by means of washers 14 and screws 21. Most preferably, light source housing 24 is formed from a mold such that the double convex lens shaped end and flange end are constructed of a single, continuous piece of polycarbonate material.

Power source housing 26 is constructed, most preferably, of a durable plastic material such as polycarbonate, polystyrene and the like, which is capable of being formed from a mold such that power source housing 26 forms a base which supports light array housing 24 in an upright position. Also, according to a presently preferred embodiment, a sufficient amount of air is trapped in power source housing 26 and light source housing 24 so as to impart buoyancy to the marker light of the instant invention.

In accordance with a presently preferred embodiment of the present invention, LEDs 16 are disposed on printed circuit board 22 such that they comprise linear arrays which are aligned in parallel rows. Printed circuit board 22 is substantially rectangular in shape such that, when folded, the opposite ends of printed circuit board 22 substantially meet. As such, printed circuit board 22 includes two panels such that LEDs 1–20 disposed on the first panel face in a direction generally opposite to LEDs 21–40 disposed on the second panel, whereby LEDs 1–40 project light in substantially parallel beams. Although alignment of LEDs 16 in parallel rows is most preferable, it will be appreciated by those skilled in the art that LEDs 16 can be disposed on printed circuit board 22 in any pattern or in a random fashion. Additionally, it will be appreciated that the marker light of the present invention can employ multiple printed circuit boards 22 with LEDs 16 disposed on each to increase the size and luminous intensity of the marker light. Moreover, it will be appreciated that printed circuit board 22 can take any shape, including, but not limited to a circle, cylinder, square or triangle.

Printed circuit board 22 in a presently prefered embodiment of the present invention includes electronic circuit 32 for continuously illuminating LEDs 16 when power source 28 is activated by switch 29. Additionally, electronic circuit 32 includes flasher circuit 36 for intermittently turning LEDs 1–40 on and off at a predetermined time interval again, most preferably 1 pps, to provide a flashing light when flasher circuit 36 is activated by switch 29.

Figure 7:
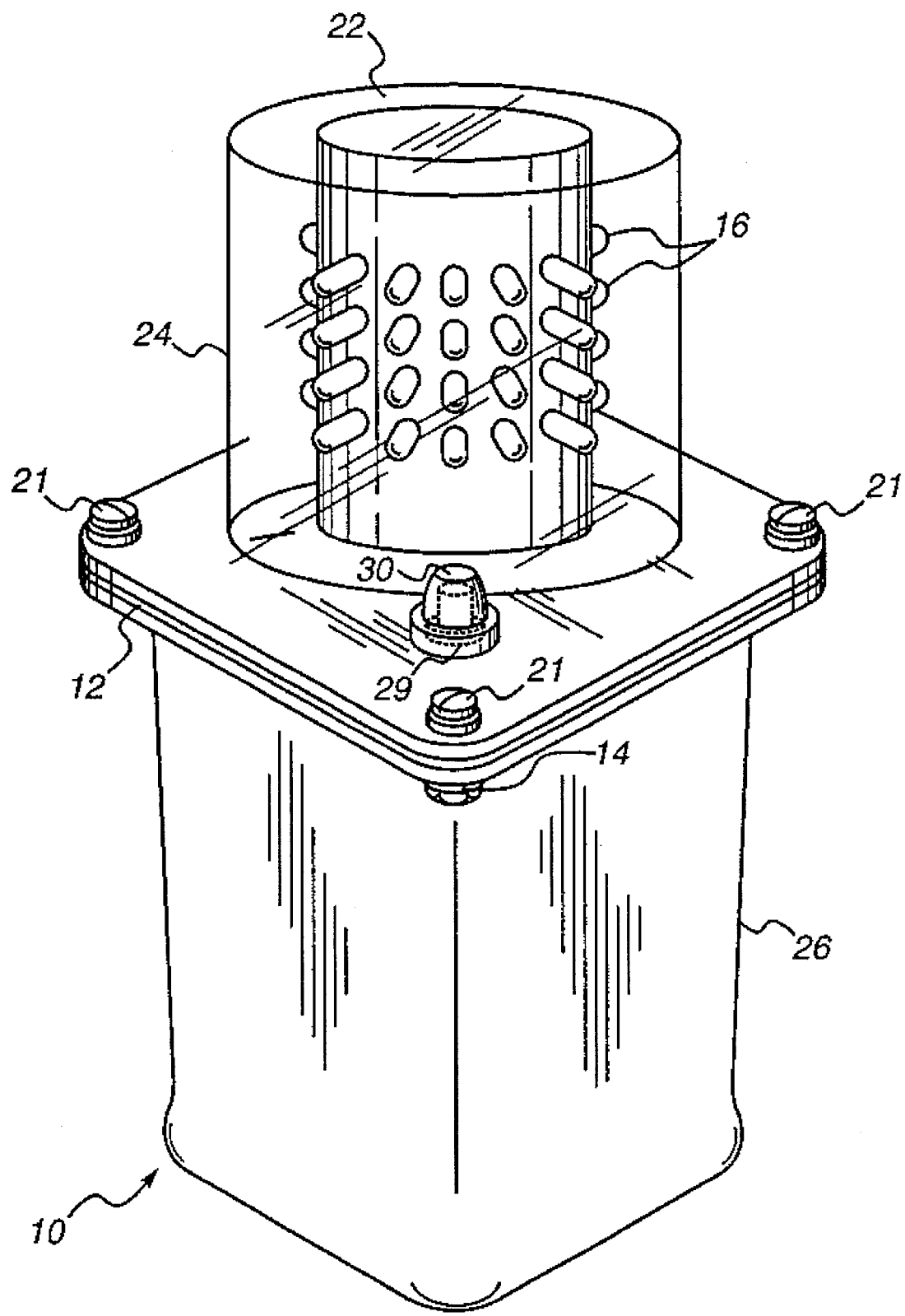
FIG. 7 is a perspective view of a second preferred embodiment of a marker light device constructed in accordance with the present invention.

FIG. 7 includes a second preferred embodiment of marker light 10 constructed in accordance with the present invention. The marker light of the second preferred embodiment differs from marker light 10 of the first preferred embodiment in that the former includes a cylindrically shaped printed circuit board 22, as well as a cylindrically shaped light source housing 24. Additionally, the marker light of the second preferred embodiment, most preferably, includes sequencer circuit 38 instead of flasher circuit 36. Accordingly, sequencer circuit 38 causes LEDs 1–40 to intermittently turn on and off at predetermined time intervals to provide the appearance of a rotating beacon. In all other respects, the operation of the marker light of the second preferred embodiment is essentially the same as the marker light of the first preferred embodiment.

Figure 8:
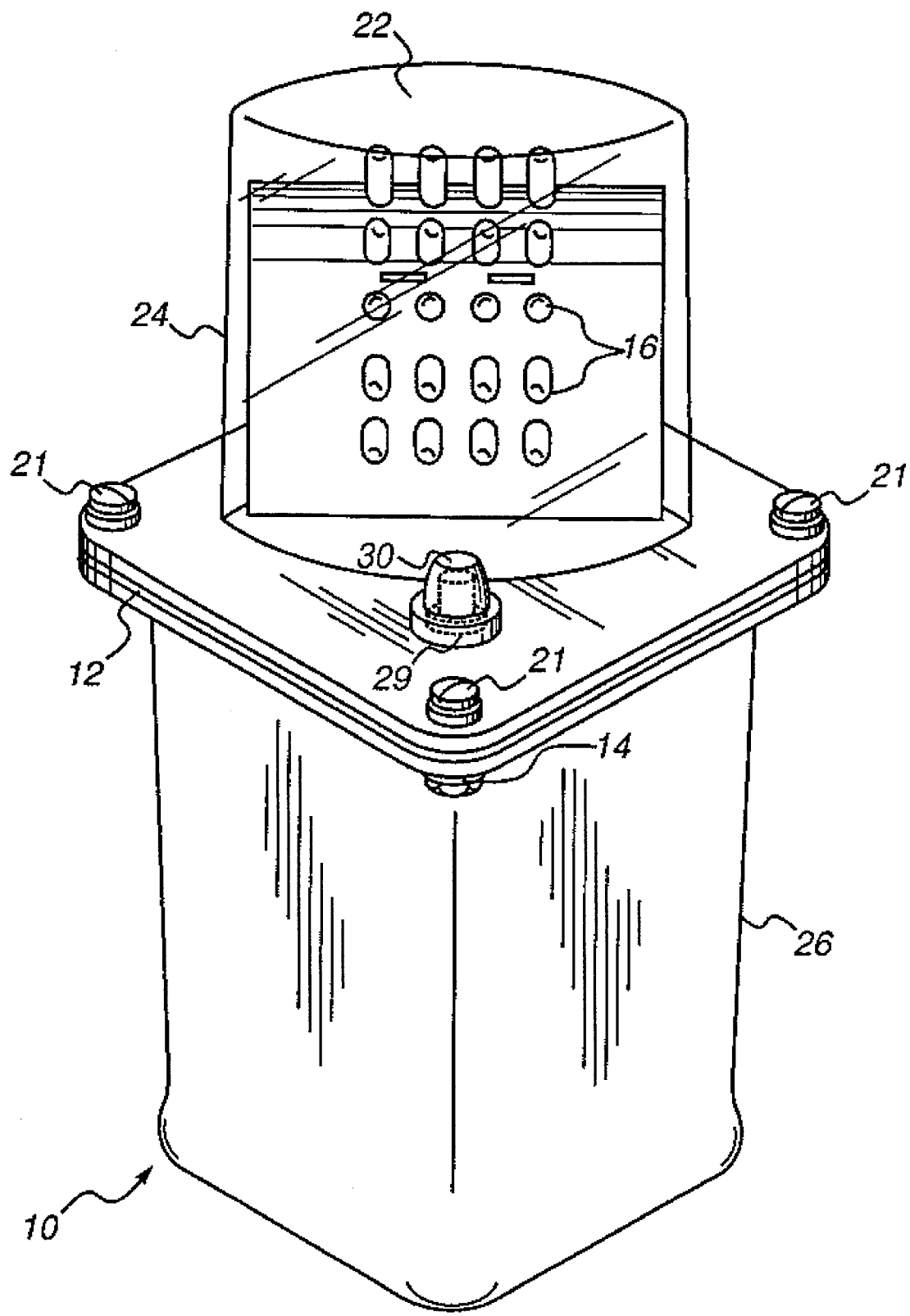
FIG. 8 is a perspective view of a third preferred embodiment of a marker light device constructed in accordance with the present invention.

FIG. 8 includes a third preferred embodiment of marker light 10 constructed in accordance with the present invenion. The marker light of the third preferred embodiment employs, most preferably, a substantially rectangularly shaped printed circuit board 22 which is comprised of a convex surface and concave surface, whereby LEDs 16 are disposed on the convex surface such that LEDs 16 project light in diverging beams so as to provide a source of diffuse light. Printed circuit 32 can include flasher circuit 36 in addition to circuitry for continuously illuminating LEDs 16. In all other respects, the operation of the marker light of the third preferred embodiment is essentially the same as the marker light of the first preferred embodiment.

Figure 9:
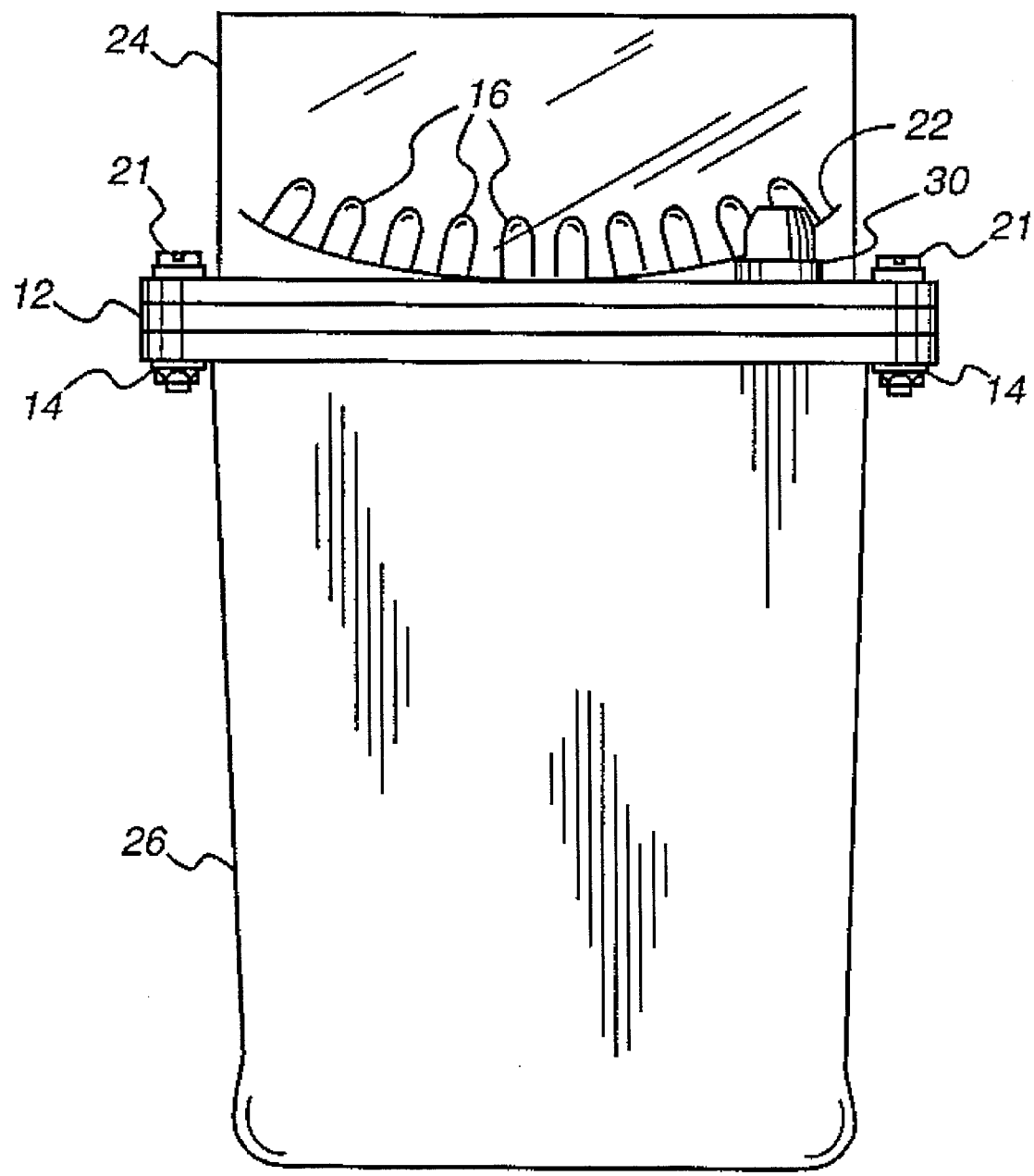
FIG. 9 is a perspective view of a fourth preferred embodiment of a marker light device constructed in accordance with the present invention.

FIG. 9 includes a fourth preferred embodiment of marker light 10 constructed in accordance with the present invention. The marker light of the fourth preferred embodiment differs from the marker light of the third preferred embodiment in that the former has LEDs 16 disposed on the concave surface such that the LEDs 16 project light in converging beams so as to provide a concentrated point illuminator. In all other respects, the operation of the marker light of the fourth preferred embodiment is essentially the same as the marker light of the third preferred embodiment. It will be appreciated by those of ordinary skill that the marker light of the present invention may employ any combination of flexible circuit boards and accompanying circuitry and housings, such as that described in the first, second, third and fourth preferred embodiments, so as to create a larger marker light with multiple light sources.

Although the invention has been described in detail for the purpose of illustration, it is to be understood that such detail is solely for that purpose and that variations can be made therein by those skilled in the art without departing from the spirit and scope of the invention except as it may be limited by the claims.

What is claimed as new and desired to be protected by Letters Patent is set forth in the appended claims.

I claim:

1. A marker light device comprising:

a) at least one flexible circuit board;

b) at least one light emitting diode disposed on said at least one flexible circuit board and electrically connected thereto, wherein said an least one light emitting diode is comprised of an array of flight emitting diodes wherein said array includes at least two parallel linear arrays of light emitting diodes;

c) a power source electrically connected to said at least one flexible circuit board, thereby causing the illumination of said at least one light emitting diode;

d) a power source housing of a fluid tight material for housing said power source;

e) a light source housing of a fluid tight material for housing said at least one light emitting diode;

f) a gasket positioned between said power source housing and said light source housing for providing a fluid seal therebetween; and g) fastening means for securing said power source housing to said light source housing, wherein said at least one flexible circuit board is cylindrically shaped and includes an electronic circuit for intermittently turning said light emitting diodes comprising said array on and off in sequence at predetermined time intervals to provide the appearance of a rotating deacon.

2. A marker light device comprising:

a) at least one flexible circuit board.;

b) at least one light emitting diode disposed on said at least one flexible circuit board and electrically connected thereto, wherein said at least one light emitting diode is comprised of an array of light emitting diodes wherein said array includes at least two parallel linear arrays of light emitting diodes;

c) a power source electrically connected to said at least one flexible circuit board, thereby causing the illumination of said at least one light emitting diode;

d) a power source housing of a fluid tight material for housing said power source;

e) a light source housing of a fluid tight material for housing said at least one light emitting diode;

f) a gasket positioned between said power source housing and said light source housing for providing a fluid seal therebetween; and g) fastening means for securing said power source housing to said light source housing, wherein said at least one flexible circuit board, when folded such that the opposite ends of said at least one flexible circuit board substantially meet, includes two panels such that said array of light emitting diodes disposed on said first panel faces in a direction generally opposite to said array of light emitting diodes disposed on said second panel, whereby said light emitting diodes project light in substantially parallel beams.

3. A marker light device comprising:

a) at least one flexible circuit board;

b) at least one light emitting diode disposed on said at least one flexible circuit board and electrically connected thereto, wherein said at least one light emitting diode is comprised of an array of light emitting diodes wherein said array includes at least two parallel linear arrays of light emitting diodes;

c) a power source electrically connected to said at least one flexible circuit board, thereby causing the illumination of said at least one light emitting diode;

d) a power source housing of a fluid tight material for housing said power source;

e) a light source housing of a fluid tight material for housing said at least one light emitting diode;

f) a gasket positioned between said power source housing and said light source housing for providing a fluid seal therebetween; and g) fastening means for securing said power source housing to said light sources housing, wherein said at least one flexible circuit board is folded into the shape of a cylinder such that said array of light emitting diodes disposed on said at least one flexible circuit board project light in substantially parallel beams in substantially all directions.

4. A marker light device comprising:

a) at least one flexible circuit board;

b) at least one light emitting diode disposed on said at least one flexible circuit board and electrically connected thereto, wherein said at least one light emitting diode is comprised of an array of light emitting diodes wherein said array includes at least two parallel linear arrays of light emitting diodes;

c) a power source electrically connected to said at least one flexible circuit board, thereby causing the illumination said at least one light emitting diode;

d) a power source housing of a fluid tight material for housing said power source;

e) a light source housing of a fluid tight material for housing said at least one light emitting diode;

f) a gasket positioned between said power source housing and said light source housing for providing a fluid seal therebetween; and g) fastening means for securing said power source housing to said light sources housing, wherein said at least one flexible circuit board is comprised of a convex surface and a concave surface, whereby said array of light emitting diodes are disposed on said convex surface, thereby causing said light emitting diodes to project light in diverging beams so as to provide a source of diffuse light.

5. A marker light device comprising:

a) at least one flexible circuit board;

b) a plurality of light emitting diodes disposed on said at least one flexible circuit board and electrically connected thereto, said plurality of light emitting diodes being comprised of at least two parallel linear arrays of light emitting diodes and said flexible circuit board being comprised of a concave surface and a convex surface, whereby said plurality of light emitting diodes are disposed on said concave surface, thereby causing said light emitting diodes to project light in converging beams so as to provide a concentrated point illuminator; and c) a power source electrically connected to said at least one flexible circuit board, thereby causing the illumination of said light emitting diodes.

\* \* \* \* \*